(12) United States Patent
Holzmann

(10) Patent No.: US 7,760,007 B2
(45) Date of Patent: Jul. 20, 2010

(54) LOW VOLTAGE ANALOG CMOS SWITCH

(75) Inventor: Peter Holzmann, San Jose, CA (US)

(73) Assignee: Nuvoton Technology Corporation (TW)

( * ) Notice: Subject to any disclaimer, the term of this patent is extended or adjusted under 35 U.S.C. 154(b) by 0 days.

(21) Appl. No.: 12/333,236

(22) Filed: Dec. 11, 2008

(65) Prior Publication Data

US 2010/0148851 A1 Jun. 17, 2010

(51) Int. Cl.
*H03K 17/687* (2006.01)
(52) U.S. Cl. .................. 327/427; 327/434; 327/437; 327/534
(58) Field of Classification Search .............. 327/427, 327/434, 437, 534
See application file for complete search history.

(56) References Cited

U.S. PATENT DOCUMENTS

| | | | | |
|---|---|---|---|---|
| 3,866,064 A | * | 2/1975 | Gregory et al. | 327/437 |
| 4,529,897 A | * | 7/1985 | Suzuki et al. | 327/437 |
| 5,682,050 A | * | 10/1997 | Williams | 257/368 |
| 5,689,209 A | * | 11/1997 | Williams et al. | 327/425 |
| 5,767,733 A | * | 6/1998 | Grugett | 327/534 |
| 5,880,620 A | * | 3/1999 | Gitlin et al. | 327/534 |
| 5,933,046 A | | 8/1999 | Ramet et al. | |
| 6,191,615 B1 | * | 2/2001 | Koga | 326/81 |
| 6,700,435 B2 | * | 3/2004 | Becker | 327/536 |
| 6,828,846 B2 | * | 12/2004 | Tsukazaki et al. | 327/404 |
| 6,965,263 B2 | * | 11/2005 | Bringivijayaraghavan | 327/537 |
| 7,119,585 B2 | | 10/2006 | Ranganathan | |
| 7,129,766 B2 | * | 10/2006 | Steinhagen | 327/427 |
| 7,224,206 B2 | * | 5/2007 | Pappalardo et al. | 327/536 |
| 7,372,301 B2 | * | 5/2008 | Fukuoka et al. | 326/81 |

* cited by examiner

*Primary Examiner*—Kenneth B. Wells
(74) *Attorney, Agent, or Firm*—Townsend and Townsend and Crew LLP

(57) ABSTRACT

A CMOS analog switch circuit includes an NMOS switch transistor, a PMOS switch transistor, and a bias circuit. In an embodiment, the bias circuit includes a first and a second native bias transistors having their gate terminals coupled to a first and a second terminals of the CMOS switch circuit, respectively. The source terminals of the first and the second native bias transistors are coupled together and are also coupled to the body terminal of the PMOS switch transistor. In an configuration, the first and the second native bias transistors are characterized by substantially 0V threshold voltages, and the PMOS switch transistor is configured to exhibit a lower on-resistance in response to the greater of the voltages of the first terminal and the second terminal of the CMOS analog switch circuit.

17 Claims, 4 Drawing Sheets

US 7,760,007 B2

LOW VOLTAGE ANALOG CMOS SWITCH

CROSS-REFERENCES TO RELATED APPLICATIONS

Not applicable

STATEMENT AS TO RIGHTS TO INVENTIONS MADE UNDER FEDERALLY SPONSORED RESEARCH OR DEVELOPMENT

Not applicable

REFERENCE TO A "SEQUENCE LISTING," A TABLE, OR A COMPUTER PROGRAM LISTING APPENDIX SUBMITTED ON A COMPACT DISK

Not applicable

FIELD OF INVENTION

The present invention relates generally to electronic circuit techniques. More specifically, embodiments of the present invention relate to techniques for cost effective low-voltage analog switch circuitry. Merely by way of example, embodiments of the invention have been applied to a low-voltage analog CMOS switch circuit. But it would be recognized that the invention has a much broader range of applicability. For example, embodiments of the present invention can be applied in various low-voltage analog devices, including voice and audio band products.

BACKGROUND OF THE INVENTION

Voice and audio band applications often include selectable paths for selecting different inputs and outputs, and generally include switches to select these inputs and outputs. In addition, if analog to digital conversion is required, a switched capacitor circuit is often used, including sampling switches to store the analog samples on the capacitors. In many applications, an MOS transistor is often used as a switch device. In a CMOS technology a transmission gate can be used to establish the switch.

FIG. 1 is a simplified view diagram illustrating a conventional switch device 100. As shown, switch circuit 100 has a PMOS transistor 110 with two terminals connected to terminals 101 and 102 of switch device 100, respectively. Typically, an MOS transistor is usually symmetrical in structure with respect to its source and drain terminals. Accordingly, either one of the terminals of the PMOS transistor 110 can function as a source or drain terminal, depending on the direction of current flow, or the relative magnitude of the voltages at terminals 101 and 102, respectively. PMOS transistor 110 also includes a gate terminal 121 that controls the flow of the current. Additionally, PMOS transistor 110 also has a body or bulk terminal 122.

Switch devices having only one switch transistor, such as switch device 100, can suffer from a number of limitations. For example, gate terminal 121 of PMOS switch 100 is often biased at ground and body terminal 122 at a high voltage supply. As the input signal drops and approaches the threshold voltage Vtp, switch 100 starts to turn off. Therefore, the useful magnitude of the input signal is limited and switch circuit 100 can not operate in the full supply voltage range. Additionally, with a fixed body bias, the performance of switch device 100 can be degraded because of raised effective threshold voltage due to body effect and leakage current caused by forward biased source to body junction at various operating conditions. Similarly, a switch device having a single NMOS switch transistor can also be susceptible to such limitations.

The operating range of input voltage in an analog switch can be improved with a CMOS switch device. FIG. 2 is a simplified schematic diagram illustrating a conventional CMOS switch device 200. As shown, switch device 200 has an NMOS transistor 210 and a PMOS transistor 220. Each of transistors 210 and 220 has two terminals connected to terminals 201 and 202 of CMOS switch device 200, respectively. As noted above, either one of the terminals of an MOS transistor can function as a source or drain terminal, depending on the direction of current flow, or the relative magnitude of the voltages at terminals 201 and 202, respectively. Additionally, NMOS transistor 210 has a gate terminal 211 and PMOS transistor 220 also has a gate terminal 221 that controls the flow of the current.

A CMOS switch is usually controlled by complementary control signals Vg and its complement signal Vg bar. When Vg is low, both transistors are off, and the switch is open. In FIG. 2, when Vg is high, both transistors are on, creating a low-resistance path. The body terminal of NMOS transistor 210 is usually biased at the lowest voltage, whereas the body terminal of PMOS transistor 220 is usually biased at the highest voltage. CMOS switch device 200 has a greater dynamic analog signal range in the On state as compared with switch device 100. However, as a bi-directional switch CMOS switch device 200 still faces the problems of body effect, including raised effective threshold voltage due to body effect and leakage current caused by forward biased source to body junction at various operating conditions.

Various techniques have been proposed to resolve the problems in analog switch circuits caused by body effects. As discussed in detail below, these conventional techniques are usually not satisfactory. For example, conventional techniques often require additional circuitry or place a high demand on certain circuit components, and therefore, can be more complex and expensive.

Accordingly, it is desirable to provide simple and cost-effective techniques for improving analog switch circuits.

BRIEF SUMMARY OF THE INVENTION

As noted above, conventional switch circuits based on MOS transistors often suffer from body effect related problems, such as increased resistance and leakage current. According to embodiments of the present invention, simple and cost-effective techniques are provided for a CMOS analog switch circuit suitable for low-voltage applications.

Embodiments of the present invention provide techniques for a cost-effective analog switch circuit. In a specific set of embodiments, the invention provide techniques for applying adaptable body bias to one or more switch transistors in a CMOS switch circuit to reduce resistance and leakage current in the switch circuit. In these embodiments, the bias circuit includes native bias transistors and does not require additional level-shifting circuitry, which can lead to chip area saving and cost reduction. In some embodiments, the body bias is adapted to be responsive to the terminal voltages of the CMOS switch to reduce threshold voltage increase caused by body effect in both directions of current flow. In other words, the effective threshold voltage is lowered in response to an input signal. As a result, the resistance of the switch circuit can be reduced. In other embodiments, the adaptable body bias can also be applied to an NMOS switch or a PMOS switch. Merely as an example, a bias circuit includes two native bias transistors having substantially 0V threshold voltages. The bias transistors have their source terminals coupled to the body terminal of a switch transistor, whereas their gate terminals are coupled, respectively, to the two terminals of the CMOS switch circuit. In other embodiments, the adaptable body bias can also be applied to an NMOS switch or a PMOS switch.

According to a specific embodiment, the present invention provides a CMOS analog switch circuit having a first terminal and a second terminal, an NMOS switch transistor, and a PMOS switch transistor. The NMOS switch transistor is coupled between the first and second terminals of the CMOS switch circuit and has a gate terminal that is configured to control a current flow through the NMOS switch transistor between the first and second terminals in response to a first control signal. The NMOS switch transistor also has a body terminal for providing a body bias to the NMOS switch transistor. Similarly, the PMOS switch transistor is coupled between the first and second terminals of the CMOS switch circuit and has a gate terminal that is configured to control a current flow through the PMOS switch transistor between the first and second terminals in response to a second control signal. The PMOS switch transistor also has a body terminal for providing a body bias to the PMOS switch transistor.

According to the embodiment, the CMOS analog switch circuit also has a first native transistor and a second native transistor functioning as bias transistors. The first and the second native bias transistors have their gate terminals coupled to the first and second terminals of the CMOS switch circuit, respectively. The source terminals of the first and the second native bias transistors are coupled together and are also coupled to the body terminal of the PMOS switch transistor. In this configuration, the first and the second native bias transistors are native transistors having substantially 0V threshold voltages, and the body terminal of the PMOS switch transistor is configured to be biased at substantially the greater of the voltages at the gate terminals of either the first or the second native bias transistors.

In a specific embodiment of the CMOS analog switch circuit described above, since the bias transistors are native transistors having substantially zero threshold voltages, the gate voltages of the bias transistors are substantially equal to the voltages at their respective source terminals which is coupled to the body terminal of the PMOS switch transistor. As a result, the bias circuit is configured to apply to the body terminal of the PMOS switch transistor the greater of the voltages of the first and second terminals of the CMOS analog switch circuit. Therefore, the effective source terminal is connected to the body terminal of the PMOS switch transistor, substantially independent of the direction or magnitude of current flow. As a result, the magnitude and variation of threshold voltage of the PMOS switch transistor is reduced, and the performance of the analog circuit employing such a CMOS switch can be improved.

In an embodiment, the first and the second native bias transistors are of N-channel type. In another embodiment, the CMOS analog switch circuit also includes a third bias transistor configured to bias the body terminal of the PMOS switch transistor at a first supply voltage when the first control signal is at a state that turns off the CMOS analog switch transistor. In a specific embodiment, the third bias transistor is an PMOS transistor that has a gate terminal coupled to the first control signal. In another embodiment, the CMOS analog switch circuit further includes a current bias circuit having a first and a second transistor in series between a second power supply terminal and the coupled source terminals of the first and the second bias transistors. In a specific embodiment, the CMOS analog switch circuit is included in a single integrated circuit chip.

According to an alternative embodiment, the invention provides a CMOS analog switch circuit similar to the CMOS analog switch circuit described above, but has a bias circuit coupled to the NMOS switch transistor. In this embodiment, the NMOS switch transistor is configured to have a body terminal that can be biased to different bias voltages. For example, the NMOS transistor may be formed in a P-type well region which is isolated from a substrate that is usually connected to a supply voltage, such as an electrical ground. In this embodiment, the CMOS switch circuit can have a bias circuit similar to the bias circuit described above, but with the P-type and N-type conductivities reversed. For example, the bias circuit is coupled to the body terminal of the NMOS switch transistor and has two bias transistors that are native transistors having substantially 0V threshold voltages. In this case, the body terminal of the NMOS switch transistor is configured to be biased at substantially the smaller of the voltages at the gate terminals of either the first or the second bias transistors. In an embodiment, the bias circuit is configured to apply to the body terminal of the NMOS switch transistor the smaller of the voltages of the first and second terminals of the CMOS analog switch circuit. In an embodiment, the two bias transistors are of P-channel type. In an embodiment, the CMOS analog switch circuit also has a third bias transistor configured to bias the body terminal of the NMOS switch transistor at a first supply voltage when the first control signal is at a state that turns off the CMOS analog switch transistor. In a specific embodiment, the third bias transistor is an NMOS transistor having a gate terminal coupled to the first control signal. In another embodiment, the CMOS analog switch circuit also include a current bias circuit having a first and a second transistors in series between a second power supply terminal and the coupled source terminals of the first and the second bias transistors. In an embodiment, the CMOS analog switch circuit is included in a single integrated circuit chip.

According to another embodiment of the present invention, an analog switch circuit includes a first terminal and a second terminal, an MOS switch transistor, and a bias circuit. The MOS switch transistor is coupled between the first and second terminals of the MOS switch circuit and has a gate terminal configured to control a current flow through the MOS switch transistor between the first and second terminals in response to a first control signal. The MOS switch transistor further including a body terminal for providing a body bias to the MOS switch transistor. The bias circuit includes a first and a second native bias transistors having their gate terminals coupled to the first and second terminals of the analog switch circuit, respectively. The source terminals of the first and the second native bias transistors are coupled together and also coupled to the body terminal of the MOS switch transistor. In this embodiment, the first and the second native bias transistors are native transistors, and the body terminal of the MOS switch transistor is configured to be biased at substantially equal to a voltage at the gate terminal of either the first or the second native bias transistors for providing a lower channel resistance in the MOS switch transistor. In this embodiment, the body terminal of the MOS switch transistor is biased at a voltage substantially equal to a voltage at either the first or the second terminals of the analog switch circuit, depending on the relative magnitude of the voltages at the first or the second terminals of the analog switch circuit. In some embodiments, the native transistors have substantially 0V threshold voltages, whereas in other embodiments, process and manufacturing variations may cause the threshold voltages to vary by, e.g., approximately 0.1 V.

In an embodiment of the analog switch circuit including a P-type MOS switch transistor, the bias circuit is configured to apply to the body terminal of the MOS switch transistor the greater of the voltages of the first and second terminals. In another embodiment of the analog switch circuit having an N-type MOS switch transistor, the bias circuit is configured to apply to the body terminal of the MOS switch transistor the smaller of the voltages of the first and second terminals. In another embodiment, the analog switch circuit also includes a third bias transistor configured to bias the body terminal of the MOS switch transistor at a first supply voltage when the first control signal is at a state that turns off the MOS analog switch transistor. In a specific embodiment, the third bias transistor includes a gate terminal coupled to the first control signal. In an embodiment, the analog switch circuit also includes a current bias circuit having a first and a second transistors in series between a second power supply terminal and the coupled source terminals of the first and the second native bias transistors.

Many benefits are achieved by way of the present invention over conventional techniques. For example, the present invention provides easy to use designs that that are compatible with conventional integrated circuit design and fabrication process technologies.

Embodiments of the invention provide techniques for cost-effective low voltage switches. In a specific set of embodiments, the invention provides techniques for applying an adaptable body bias to one or more switch transistors in a CMOS switch circuit to reduce the magnitude and variation in on-resistance in the switch circuit. In these embodiments, the bias circuit includes native bias transistors and does not require additionally level-shifting circuitry, which can reduce complexity and lead to chip area saving and cost reduction. In some embodiments, the body bias is adapted to be responsive to the terminal voltages of the CMOS switch to reduce threshold voltage increase and variation caused by the so-called body effect. In other embodiments, the adaptable body bias can also be applied to an NMOS switch or a PMOS switch.

In some applications, embodiments of the invention can be used to reduce analog signal distortion in audio and video applications. In other applications, embodiments of the invention can be used to reduce incomplete settling on the sampling capacitors of analog to digital converters. In other embodiments, the techniques provided by the invention can also be used in switched capacitor circuit applications. It is understood that these techniques can be easily adopted for other applications requiring cost-effective analog switches, such as audio and video applications. Depending upon the embodiments, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

As discussed above, conventional analog switch circuits often suffer from various limitations. Some of the problems with these switches are that they have finite resistance when turned on and the resistance can vary non-linearly with the inputs signal, causing distortion. In addition, the finite on-resistance causes incomplete settling on the sampling capacitors of analog to digital converters. A major contributor to the large on-resistance of a CMOS switch in the application is the so-called transistor body effect, through which the transistor threshold voltage increases as the transistor source voltage to the body voltage increases. One technique to make the on-resistance smaller is to make the switches larger. However, larger switches consumes more integrated circuit dice area and introduces more leakage and charge injection when the switches are turned to the off position. Hence, there is a need to make a cost-effective low resistive switch without increasing switch area.

Various techniques have been proposed to resolve the problem in analog switch circuits caused by body effects. One of such techniques is provided in U.S. Pat. No. 5,933,046 to S. Ramet, entitled "Low Voltage Analog Switch Having Selective Bulk Biasing Circuitry" (hereinafter "Ramet"). Ramet discloses an analog switch formed from a MOS transistor which includes means for applying to the bulk terminal of the transistor switch the voltage of either one of the two main terminals of the transistor switch as a function of the relation between the voltages of said main terminals.

Figure 1:
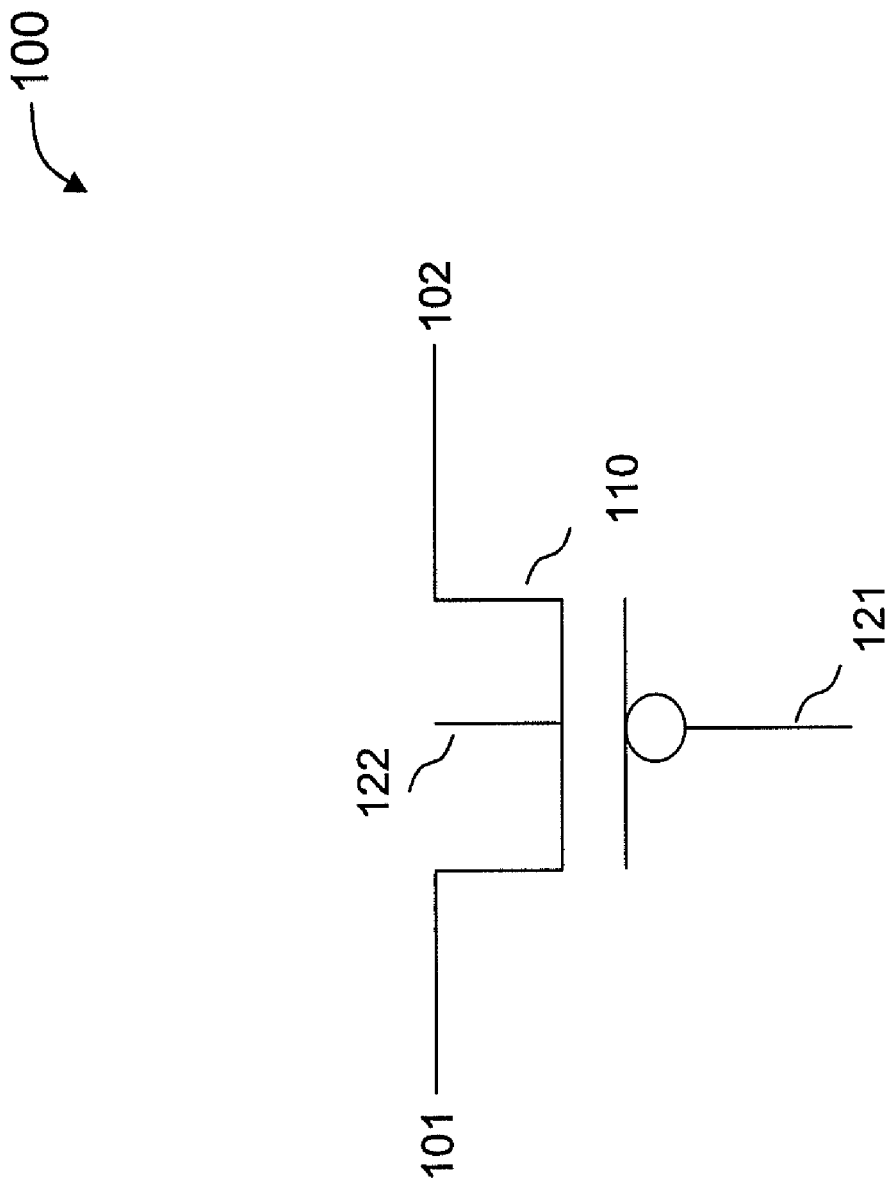
FIG. 1 is a simplified schematic diagram illustrating a conventional switch device.
Figure 2:
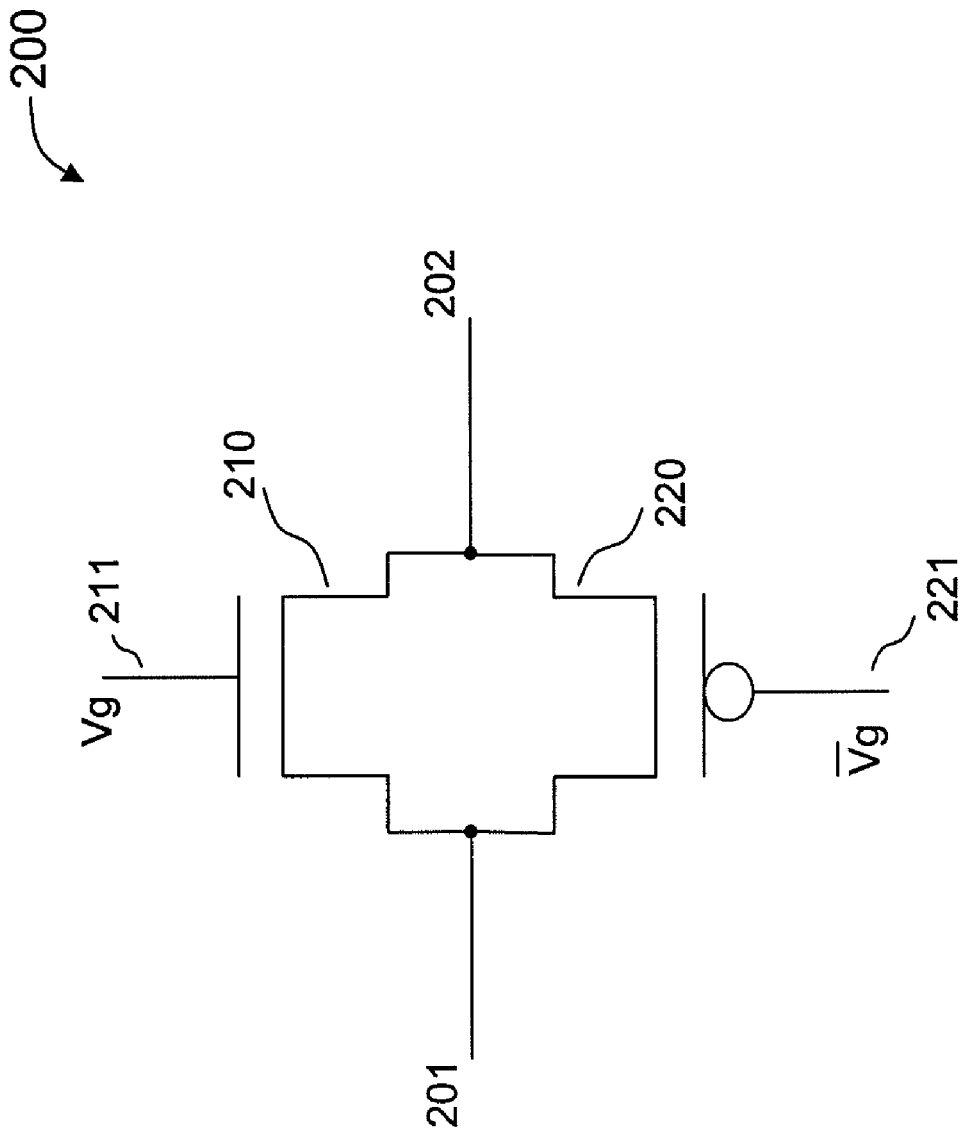
FIG. 2 is a simplified schematic diagram illustrating a conventional CMOS switch device.

In FIG. 2A, Ramet discloses a switch circuit based on a PMOS transistor whose bulk terminal is coupled to a bias circuit which includes two bipolar transistor emitter-followers connected, respectively, to the two terminals of the switch circuit. However, in order to equate the voltage at the bulk terminal of the switch to either switch terminals, Ramet requires a diode device connected between the bulk terminal and the bipolar transistor. Even though the bulk of the PMOS transistor is biased by the highest voltage of the two switch terminals, Ramet's approach is complicated and can be costly, because it requires BiCMOS process technology and extra level-shifter circuits includes the diode devices.

Ramet discloses another approach, as shown in FIG. 2B, based on MOS process technology, in which the bias circuit uses two MOS transistors configured as source followers. However, this approach still requires additional level-shifting circuitry including additional MOS transistors. Therefore, this approach can also be complicated and expensive. Furthermore, in both of Ramet's approaches, the additional level shifter requires a bias current and the delay of the level shifter can cause the bulk diodes to temporarily turn on during switching. Additionally, as discussed above, a switch circuit based on a single switch transistor suffers from reduced dynamic range of input signals. This limitation is especially detrimental in low-voltage applications.

A conventional technique for providing body bias to a CMOS switch is disclosed in U.S. Pat. No. 7,119,585 to S. Ranganathan, entitled "Sample and hold circuit based on an ultra linear switch," (hereinafter "Ranganathan"). In Ranganathan, the body bias for a CMOS switch is derived from the input signal. More specifically, Ranganathan discloses a sample and hold circuit including a plurality of input signal sampling switches including switched bulk PMOS transistors, with examples shown in FIGS. 2A and 2B.

In Ranganathan, the switch transistor has a bulk bias that uses the input signal to bias the bulk of the PMOS or NMOS transistor. This design increased the loading of the input signal and can cause distortion, because the signal now also needs to drive the bulk, which generally includes a large parasitic diode with capacitance to the silicon substrate. Also, Ranganathan only chooses one side of the switch to bias the switch for current flow in one direction. This means that the other side can potentially still forward bias the bulk diode. This is specifically an issue for switched capacitor networks where charge needs to be preserved.

As described above, conventional techniques for resolving body effects in analog switches are often unsatisfactory.

Embodiments of the invention provide techniques for cost-effective low voltage analog switches. In a specific set of embodiments, the invention provides cost-effective methods for applying an adaptable body bias to one or more switch transistors in a CMOS switch circuit to reduce resistance in the switch circuit that can improve the performance of the switch for current conduction in both directions.

Figure 3:
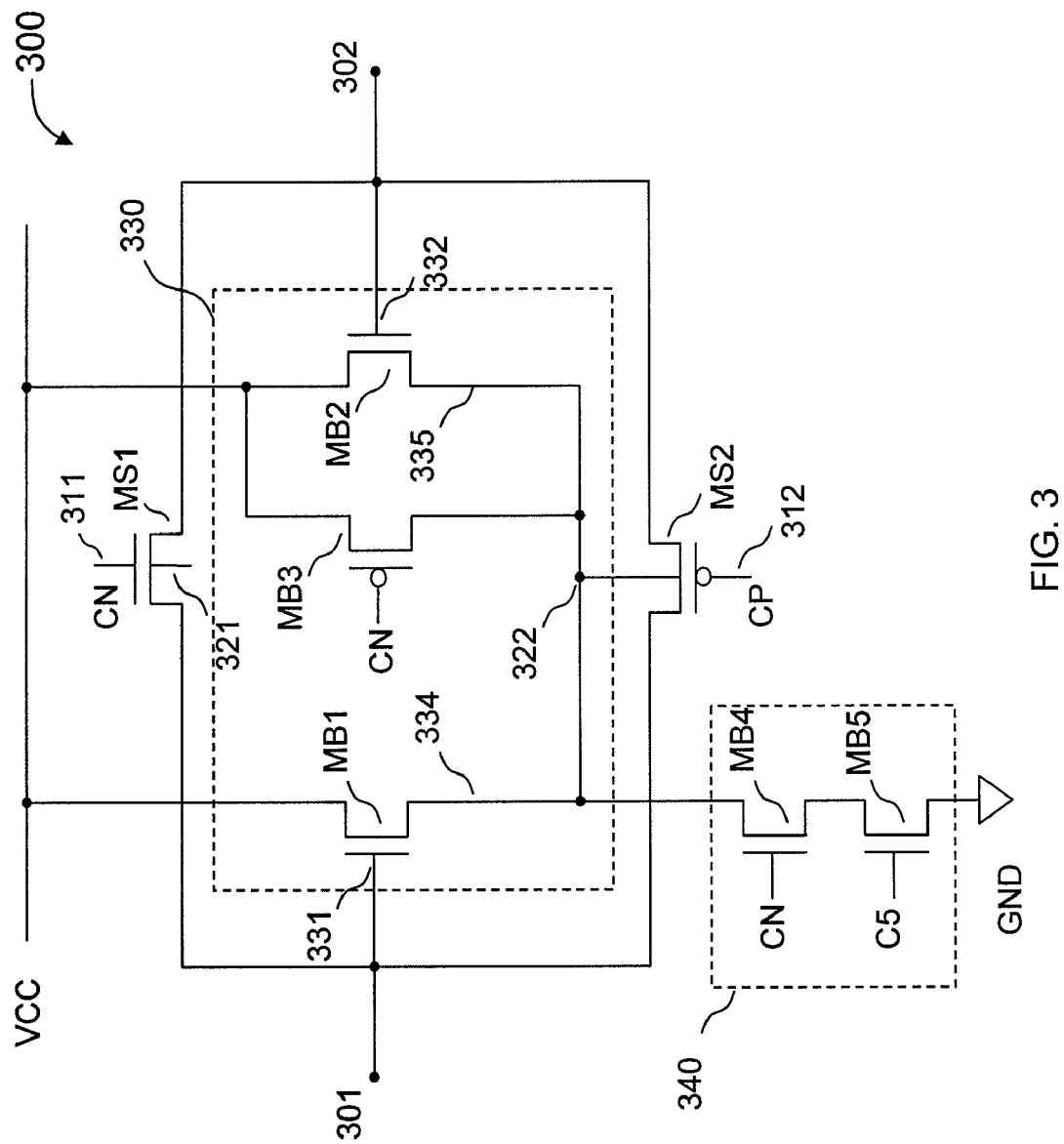
FIG. 3 is a simplified schematic diagram illustrating a CMOS switch circuit according to an embodiment of the present invention.

FIG. 3 is a simplified schematic diagram illustrating a CMOS switch circuit 300 according to an embodiment of the present invention. This diagram is merely an example, which should not unduly limit the scope of the claims herein. One of ordinary skill in the art would recognize other variations, modifications, and alternatives. As shown, CMOS switch circuit 300 includes a first terminal 301, a second terminal 302, an NMOS switch transistor MS1, and a PMOS switch transistor MS2. CMOS switch circuit 300 also includes a first bias circuit 330 and a second bias circuit 340.

In this embodiment, the NMOS switch transistor MS1 is coupled between the first terminal 301 and the second terminal 302 of CMOS switch circuit 300. Either of the two terminals of NMOS switch transistor MS1 that are coupled to terminals 301 and 302 can function as a drain or a source, depending on the direction of current flow and the relative magnitude of the voltages at terminals 301 and 302. NMOS switch transistor MS1 also has a gate terminal 311 that is configured to control a current flow through the NMOS switch transistor MS1 between terminals 301 and 302 in response to a first control signal CN. The NMOS switch transistor MS1 also has a body terminal 312 for providing a body bias to NMOS switch transistor MS1. Similarly, the PMOS switch transistor MS2 is coupled between the first and second terminals, 301 and 302, respectively, of CMOS switch circuit 300 and has a gate terminal 321 that is configured to control a current flow through PMOS switch transistor MS2 between the first and second terminals, 301 and 302, respectively, in response to a second control signal CP. Similar to NMOS switch transistor MS1, the drain and source terminals of MS2 are determined by the direction of current flow. PMOS switch transistor MS2 also has a body terminal 322 for providing a body bias to the PMOS switch transistor MS2. Note that in CMOS switch circuit 300, control signals CN and CP are usually complementary signals, e.g., one is high and the other is low, and vice versa. However, these control signals can overlap during transition. This is caused by. e.g., parasitic capacitances and resistances, which can introduce delay to either one of the signals.

As used herein, the term "body terminal" or "bulk terminal" of an MOSFET means a terminal for electrically contacting to a body region in which a channel region is formed. Depending on the embodiment, the body region can be formed in a p-type well region for an NMOS, a p-type semiconductor substrate for an NMOS, an n-type well region for a PMOS, or an n-type semiconductor substrate for a PMOS, etc. Usually, a semiconductor substrate is connected to a power supply terminal, e.g. a ground terminal or Vcc terminal, whereas a well region can usually be biased to a bias voltage, which may be different from ground or Vcc.

As shown in FIG. 3, CMOS analog switch circuit 300 also has a bias circuit 330 that includes a first bias transistor MB1 and a second bias transistor MB2 having their gate terminals, 331 and 332, respectively, coupled to the first terminal 301 and second terminal 302 of CMOS switch circuit 300, respectively. The source terminals of the first and the second bias transistors, 334 and 335, respectively, are coupled together and are also coupled to the body terminal 322 of PMOS switch transistor MS2. In an embodiment, the first and the second bias transistors, MB1 and MB2, are native transistors having substantially 0V threshold voltages.

In an embodiment, a native transistor can be formed in a well region without additional threshold voltage implant. As a result, a native transistor usually has a threshold voltage substantially at 0V. However, process variation may cause the threshold voltage of a native transistor to deviate from 0V by, e.g., 0.1V.

Since the bias transistors are native transistors having substantially zero threshold voltages, the gate voltages at 331 or 332 of the bias transistors MB1 and MB2 are substantially equal to the voltages at their respective source terminals, 334 and 335, which are coupled to the body terminal 322 of the PMOS switch transistor MS2. If the gate voltage at 331 is higher than gate voltage at 332, then the body terminal 322 of MS2 is biased at the voltage at source 334, which is substantially the same as the voltage at gate 331. In the mean time, bias transistor MB2 is turned off, because the voltage at its source 335 is now higher than the voltage at its gate 332. Conversely, if the voltage at gate 332 is higher than gate voltage at 331, bias transistor MB1 is turned off and the body terminal 322 of switch transistor MS2 is biased at a voltage substantially the same at the voltage at gate 332.

Consequently, in the configuration shown in FIG. 3, body terminal 322 of PMOS switch transistor MS2 is configured to be biased at substantially the greater of the voltages at the gate terminals 331 and 332, respectively, of either the first or the second bias transistors. Additionally, gate terminal 331 is coupled to terminal 301, and gate terminal 332 is coupled to terminal 302. As a result, bias circuit 330 is configured to apply to the body terminal 322 of the PMOS switch transistor MS2 the greater of the voltages of the first and second terminals, 301 and 302, of the CMOS analog switch circuit.

In PMOS switch transistor MS2, channel current flows from source (higher voltage) terminal to drain (lower voltage) terminal. In the embodiment described above, the body terminal 322 is coupled to the source terminal in either direction of current flow. Therefore, the threshold voltage of PMOS switch transistor MS2 is minimized. Moreover, the variation and increase of threshold voltage of the PMOS switch transistor MS2 is reduced. Consequently, the performance of the analog circuit employing such a CMOS switch can be improved.

It is noted that these benefits are achieved without the limitations associated with conventional techniques, such as requiring the input signals to drive additional internal loading devices or needing additional support circuitry such as diodes for level-shifting. Thus, embodiments of the invention provide simpler and more cost-effective methods for improving analog switch circuits.

In an embodiment, the first and the second bias transistors, MB1 and MB2, are of N-channel type. In this case, the drain terminals of MB1 and MB2 can be coupled to voltage supply Vcc.

In another embodiment, CMOS analog switch circuit 300 also includes a third bias transistor MB3 configured to bias the body terminal 322 of PMOS switch transistor MS2 at a first supply voltage Vcc when the first control signal CN is at a state that turns off CMOS analog switch transistor 300. In an embodiment, the third bias transistor MB3 is a PMOS transistor. When the switch 300 is turned off, PMOS bias transistor MB3 pulls up the body terminal 322 of PMOS switch transistor MS2 to the supply voltage Vcc, such that the drain source leakage of the device is reduced.

In another embodiment, CMOS analog switch circuit 300 further includes a current bias circuit 340 having a first transistor MB4 and a second transistor MB5 in series connected with each other between the common source terminals of the native transistors and a second power supply terminal, which can be electrical ground. Current bias circuit 340 is coupled to source terminals 334 and 335 of the first and the second bias transistors, MB1 and MB2. As shown in FIG. 3, current bias circuit 340 is configured to provide a current to bias circuit 330. In an embodiment, transistor MB4 receives control signal CN. In some embodiments, transistor MB5 receives a control signal C5, which can be used for additional control functions. In a specific embodiment, the CMOS analog switch circuit can be included in a single integrated circuit chip.

As described above, FIG. 3 is a simplified diagram that depicts an embodiment of the invention in which the PMOS switch transistor MB2 has an adaptable body bias which minimizes the threshold voltage in either direction of current flow. In a specific example, PMOS switch transistor MB2 can be formed inside an N-type well region in a P-type semiconductor substrate. In other embodiments, the NMOS switch transistor MS1 may have an adaptable body bias. For example, the NMOS switch transistor may be formed in a P-type well region in an N-type semiconductor substrate. In that case, an adaptable bias can also be applied to the NMOS switch transistor, as discussed in more detail below.

According to an alternative embodiment, the invention provides a CMOS analog switch circuit similar to the CMOS analog switch circuit 300 described above in reference to FIG. 3, but has a bias circuit coupled to the NMOS switch transistor MS1, rather than being coupled to the PMOS switch transistor MS2. In this embodiment, the NMOS switch transistor MS1 is configured to have a body terminal 312 that can be biased to different bias voltages. For example, the NMOS switch transistor may be formed in a P-type well region which is isolated from a substrate that can be N-type is usually connected to a supply voltage, such as an electrical ground.

In this embodiment, the CMOS switch circuit can have a bias circuit similar to the bias circuit 330 described above, but with the P-type and N-type conductivities reversed. For example, the bias circuit is coupled to the body terminal of the NMOS switch transistor MS1 and has two bias transistors that are native transistors having substantially 0V threshold voltages. In this case, the body terminal of the NMOS switch transistor is configured to be biased at substantially the smaller of the voltages at the gate terminals of either the first or the second bias transistors. In an embodiment, the bias circuit is configured to apply to the body terminal of the NMOS switch transistor the smaller of the voltages of the first and second terminals of the CMOS analog switch circuit. In an embodiment, the two bias transistors are of P-channel type.

In an embodiment, the CMOS analog switch circuit also has a third bias transistor configured to bias the body terminal of the NMOS switch transistor at a first supply voltage when the first control signal is at a state that turns off the CMOS analog switch transistor. When the CMOS switch circuit is turned off, the third bias transistor couples the NMOS switch transistor to ground, such that the drain source leakage of the device is reduced. In a specific embodiment, the third bias transistor is an NMOS transistor having a gate terminal coupled to the first control signal. In another embodiment, the CMOS analog switch circuit also includes a current bias circuit having first and second transistors in series between a second power supply terminal and the coupled source terminals of the first and the second bias transistors. In an embodiment, the CMOS analog switch circuit is included in a single integrated circuit chip.

Although the above has been shown using a selected group of components for analog switch circuits, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

In yet another embodiment, both NMOS switch transistor and PMOS switch transistor may have adaptable body biases. For example, in a triple-well process technology, an N-type well region may be formed in a P-type substrate, and a P-type well can then be formed in the N-type well region. In this case, both NMOS switch transistor MS1 and PMOS switch transistor MS2 can have adaptable body biases, provided by a separate bias circuit similar to the examples described above. In a certain application, an analog switch circuit having only one MOS switch transistor may be desirable. Embodiments of the present invention can also be advantageous, as discussed below.

Figure 3A:
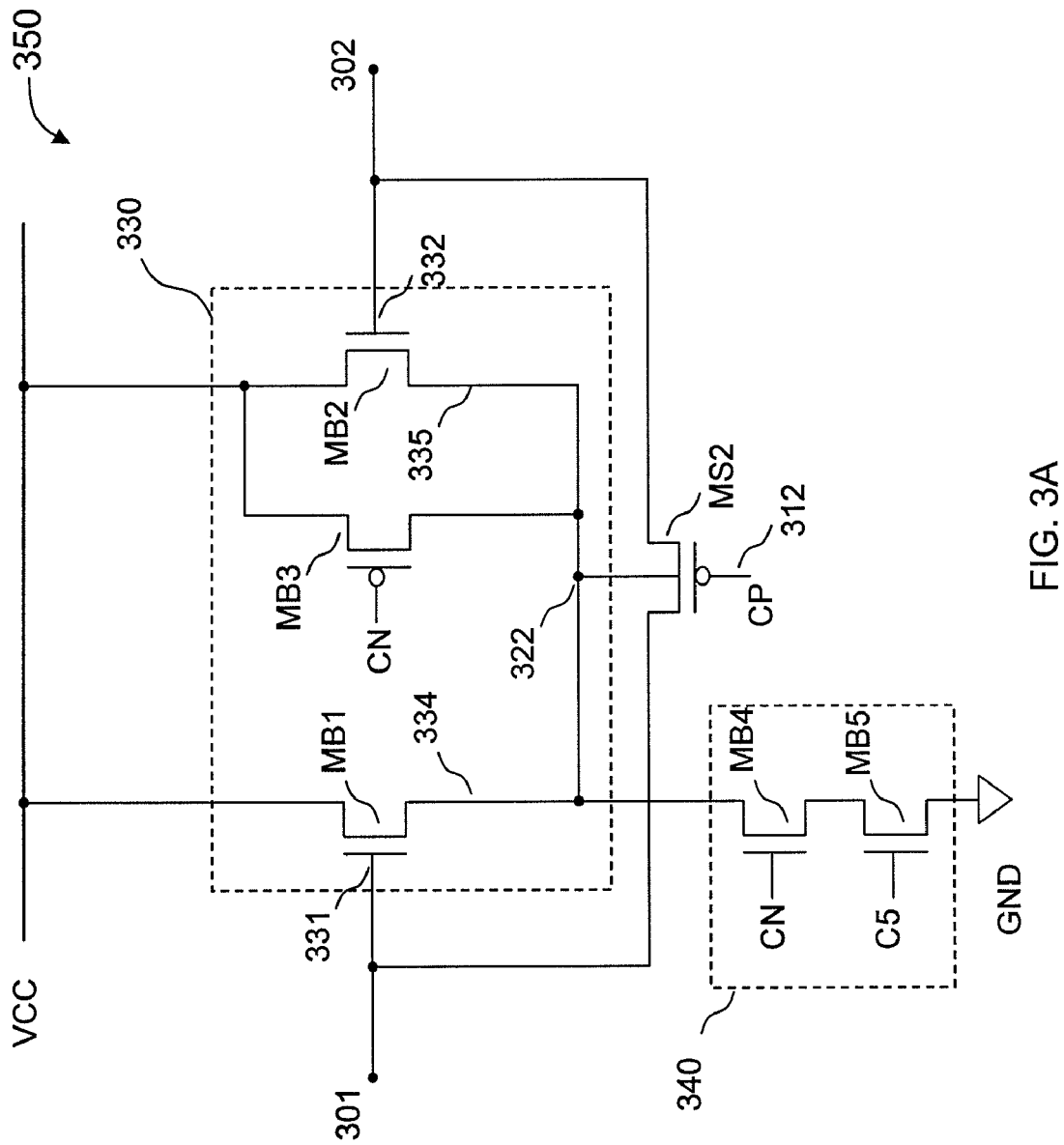
FIG. 3A is a simplified schematic diagram illustrating an MOS switch circuit according to an alternative embodiment of the present invention.

FIG. 3A is a simplified schematic diagram illustrating an MOS switch circuit 350 according to an alternative embodiment of the present invention. In this embodiment, an analog switch circuit can be formed with either a PMOS switch transistor or an NMOS transistor having adaptable body bias that is configured to minimize the threshold voltage. In an embodiment, such an analog switch circuit can be described with an MOS switch transistor. According to such an embodiment as shown in FIG. 3A, an analog switch circuit can include a first terminal 301 and a second terminal 302, an MOS switch transistor, and a bias circuit 330. The various components in FIG. 3A are similar to those in FIG. 3, and are designated with the same labels. The MOS switch transistor MS2 is coupled between the first and second terminals of the MOS switch circuit 350 and has a gate terminal 321 configured to control a current flow through the MOS switch transistor between the first and second terminals in response to a first control signal. The MOS switch transistor MS2 also has a body terminal 322 for providing a body bias to the MOS switch transistor.

In the embodiment shown in FIG. 3A, the bias circuit 330 includes first and second bias transistors, MB1 and MB2, having their gate terminals coupled to the first and second terminals of the analog switch circuit, respectively. The source terminals of the first and the second bias transistors are coupled together and also coupled to the body terminal of the MOS switch transistor. In this embodiment, the first and the second bias transistors are native transistors having substantially 0V threshold voltages, and the body terminal of the MOS switch transistor is configured to be biased at substantially equal to a voltage at the gate terminal of either the first or the second bias transistors for providing a lower channel resistance in the MOS switch transistor. In this embodiment, the body terminal of the MOS switch transistor is biased at a voltage substantially equal to a voltage at either the first or the second terminals of the analog switch circuit, depending on the relative magnitude of the voltages at the first or the second terminals of the analog switch circuit.

As shown in FIG. 3A, in an embodiment of the analog switch circuit including a P-type MOS switch transistor MS2, the bias circuit 330 is configured to apply to the body terminal 322 of the MOS switch transistor MS2 the greater of the voltages at the first and second terminals, 301 and 302. In another embodiment, the analog switch circuit can be implemented using an N-type MOS switch transistor, and the description associated with FIG. 3A can still be applicable, with N-type and P-type reversed. In such an embodiment using an NMOS transistor, the bias circuit is configured to apply to the body terminal of the MOS switch transistor the smaller of the voltages of the first and second main terminals.

In another embodiment, the analog switch circuit also includes third bias transistor, e.g., MB3 configured to bias the body terminal of the MOS switch transistor at a first supply voltage when the first control signal is at a state that turns off the MOS analog switch transistor. In a specific embodiment, the third bias transistor MB3 includes a gate terminal coupled to the first control signal. In an embodiment, the analog switch circuit also includes a current bias circuit having first and second transistors in series between a second power supply terminal and the coupled source terminals of the first and the second bias transistors.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A CMOS analog switch circuit, comprising:
a first terminal and a second terminal;
an NMOS switch transistor coupled between the first and second terminals of the CMOS switch circuit, the NMOS switch transistor having a gate terminal that is configured to control a current flow through the NMOS switch transistor between the first and second terminals in response to a first control signal, the NMOS switch transistor further including a body terminal for providing a body bias to the NMOS switch transistor;
a PMOS switch transistor coupled between the first and second terminals of the CMOS switch circuit, the PMOS switch transistor having a gate terminal that is configured to control a current flow through the PMOS switch transistor between the first and second terminals in response to a second control signal, the PMOS switch transistor further including a body terminal for providing a body bias to the PMOS switch transistor;
a first native transistor having a gate terminal coupled to the first terminal of the CMOS switch circuit and a source terminal coupled to the body terminal of the PMOS switch transistor, the first native transistor being characterized by a substantially 0V threshold voltage;
a second native transistor having a gate terminal coupled to the second terminal of the CMOS switch circuit and a source terminal coupled to the body terminal of the PMOS switch transistor, the second native transistor being characterized by a substantially 0V threshold voltage; and
a current bias circuit having first and second transistors in series between a second power supply terminal and the coupled source terminals of the first and the second native transistors,
whereby the PMOS switch transistor is configured to exhibit a lower on-resistance in response to the greater of the voltages of the first terminal and the second terminal of the CMOS analog switch circuit.

2. The CMOS analog switch circuit of claim 1 wherein the body terminal of the PMOS switch transistor is configured to be biased at the greater of the voltages of the first and second terminals of the CMOS analog switch circuit.

3. The CMOS analog switch circuit of claim 1 wherein the first and the second native transistors are of N-channel type.

4. The CMOS analog switch circuit of claim 1 further comprising a bias transistor configured to bias the body terminal of the PMOS switch transistor at a first supply voltage when the first control signal is at a state that turns off the CMOS analog switch transistor.

5. The CMOS analog switch circuit of claim 4 wherein the bias transistor is a PMOS transistor having a gate terminal coupled to the first control signal.

6. The CMOS analog switch circuit of claim 1 wherein the CMOS analog switch circuit is included in a single integrated circuit chip.

7. A CMOS analog switch circuit, comprising:
a first terminal and a second terminal;
an NMOS switch transistor coupled between the first and second terminals of the CMOS switch circuit, the NMOS switch transistor having a gate terminal that is configured to control a current flow through the NMOS switch transistor between the first and second terminals in response to a first control signal, the NMOS switch transistor further including a body terminal for providing a body bias to the NMOS switch transistor;
a PMOS switch transistor coupled between the first and second terminals of the CMOS switch circuit, the PMOS switch transistor having a gate terminal that is configured to control a current flow through the PMOS switch transistor between the first and second terminals in response to a second control signal, the PMOS switch transistor further including a body terminal for providing a body bias to the PMOS switch transistor;
a bias circuit including first and second native bias transistors, the first and second native bias transistors having their respective gate terminals coupled to the first and second terminals of the CMOS switch circuit, respectively, the source terminals of the first and the second native bias transistors being coupled together and being also coupled to the body terminal of the NMOS switch transistor; and
a current bias circuit having first and second transistors in series between a second power supply terminal and the coupled source terminals of the first and the second native transistors,
wherein the first and the second native bias transistors are characterized by substantially 0V threshold voltages, and the NMOS switch transistor is configured to exhibit a lower on-resistance in response to the smaller voltage of the first terminal and the second terminal of the CMOS analog switch circuit.

8. The CMOS analog switch circuit of claim 7 wherein the bias circuit is configured to apply to the body terminal of the NMOS switch transistor the smaller of the voltages of the first and second terminals of the CMOS analog switch circuit.

9. The CMOS analog switch circuit of claim 7 wherein the first and the second native bias transistors are of P-channel type.

10. The CMOS analog switch circuit of claim 7 further comprising a third bias transistor configured to bias the body terminal of the NMOS switch transistor at a first supply voltage when the first control signal is at a state that turns off the CMOS analog switch transistor.

11. The CMOS analog switch circuit of claim 10 wherein the third bias transistor is an NMOS transistor having a gate terminal coupled to the first control signal.

12. The CMOS analog switch circuit of claim 7 wherein the CMOS analog switch circuit is included in a single integrated circuit chip.

13. An analog switch circuit, comprising:

a first terminal and a second terminal;

an MOS switch transistor coupled between the first and second terminals of the analog switch circuit, the MOS switch transistor having a gate terminal configured to control a current flow through the MOS switch transistor between the first and second terminals in response to a first control signal, the MOS switch transistor further including a body terminal for providing a body bias to the MOS switch transistor;

a first native bias transistor and a second native bias transistor having their gate terminals coupled to the first and second terminals of the analog switch circuit, respectively, the source terminals of the first and the second native bias transistors being coupled together and being also coupled to the body terminal of the MOS switch transistor; and a current bias circuit having first and second transistors in series between a second power supply terminal and the coupled source terminals of the first and the second native transistors, wherein the first and the second native bias transistors are characterized by substantially 0V threshold voltages, wherein the MOS switch transistor is configured to exhibit a lower on-resistance depending on the voltages of the first terminal and the second terminal of the analog switch circuit.

14. The analog switch circuit of claim 13 wherein the MOS switch transistor is of P-type and the native bias transistors are configured to apply to the body terminal of the MOS switch transistor the greater of the voltages of the first and second terminals of the analog switch circuit.

15. The analog switch circuit of claim 13 wherein the MOS switch transistor is of N-type and the native bias transistors are configured to apply to the body terminal of the MOS switch transistor the smaller of the voltages of the first and second terminals of the analog switch circuit.

16. The analog switch circuit of claim 13 further comprising a third bias transistor configured to bias the body terminal of the MOS switch transistor at a first supply voltage when the first control signal is at a state that turns off the MOS analog switch transistor.

17. The analog switch circuit of claim 16 wherein the third bias transistor includes a gate terminal coupled to the first control signal.

* * * * *